(12) United States Patent
Kohyama

(10) Patent No.: US 7,550,355 B2
(45) Date of Patent: Jun. 23, 2009

(54) LOW-LEAKAGE TRANSISTOR AND MANUFACTURING METHOD THEREOF

(75) Inventor: Yusuke Kohyama, Poughkeepsie, NY (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 413 days.

(21) Appl. No.: 11/212,599

(22) Filed: Aug. 29, 2005

(65) Prior Publication Data

US 2007/0048967 A1  Mar. 1, 2007

(51) Int. Cl.
H01L 21/336 (2006.01)

(52) U.S. Cl. .................. 438/298; 438/294; 438/295; 438/296; 438/297; 438/369; 438/370; 438/371; 438/372; 438/373; 438/374; 438/375; 438/376; 438/377; 438/433; 438/449; 438/450; 438/451; 438/524; 438/525; 438/526; 438/527; 438/528; 438/529; 438/530; 438/531; 438/532

(58) Field of Classification Search ......... 438/294–298, 438/369–377, 433, 449–451, 524–532
See application file for complete search history.

(56) References Cited

U.S. PATENT DOCUMENTS

| | | | | |
|---|---|---|---|---|
| 4,918,027 A | * | 4/1990 | Fuse et al. | 438/524 |
| 5,047,359 A | * | 9/1991 | Nagatomo | 438/524 |
| 5,795,801 A | * | 8/1998 | Lee | 438/199 |
| 6,489,223 B1 | * | 12/2002 | Hook et al. | 438/524 |
| 6,521,493 B1 | * | 2/2003 | Alsmeier et al. | 438/199 |
| 6,613,635 B2 | * | 9/2003 | Oda et al. | 438/294 |
| 7,098,067 B2 | * | 8/2006 | Adkisson et al. | 438/75 |

FOREIGN PATENT DOCUMENTS

JP  2003-229577 A  8/2003

\* cited by examiner

Primary Examiner—Kevin M Picardat
Assistant Examiner—Bac H Au
(74) Attorney, Agent, or Firm—Banner & Witcoff, Ltd.

(57) ABSTRACT

A boron ion stream may be used to implant ions, such as boron ions, into the sidewalls of an active area, such as an NFET active area. The boron ion stream has both vertical tilt and horizontal rotation components relative to the sidewalls and/or the silicon device, to provide a better line of sight onto the sidewalls. This may allow components of the silicon device to be moved closer together without unduly reducing the effectiveness of boron doping of NFET active area sidewalls, and provides an improved line of sight of a boron ion stream onto the sidewalls of an NFET active area prior to filling the surrounding trench with STI material.

11 Claims, 9 Drawing Sheets

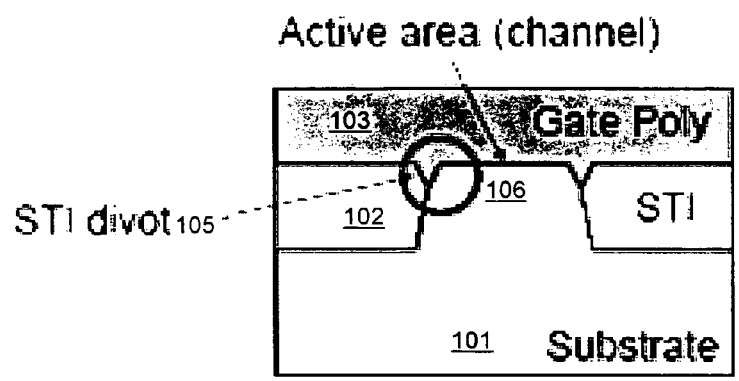
Fig.1
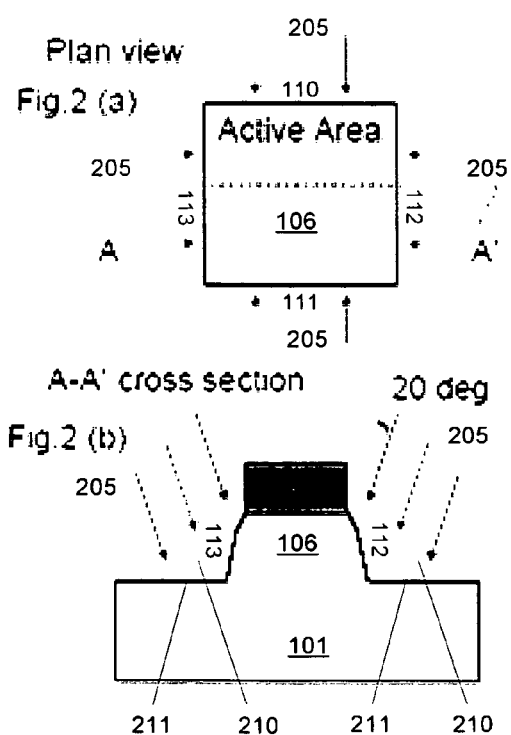
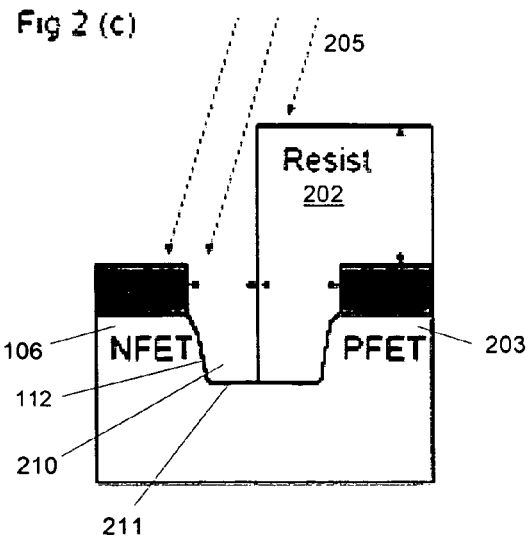

Calculation of Distance $d$ $$d = \frac{\tan(\text{tilt})}{\sqrt{1 + 1/(\tan(\text{rot}))^2}}$$

Incident angle, $\theta$ $$\theta = \tan^{-1}\left(\frac{\tan(\text{tilt}) \times \tan(\text{rot})}{\sqrt{1 + (\tan(\text{tilt}))^2 + (\tan(\text{rot}))^2}}\right)$$

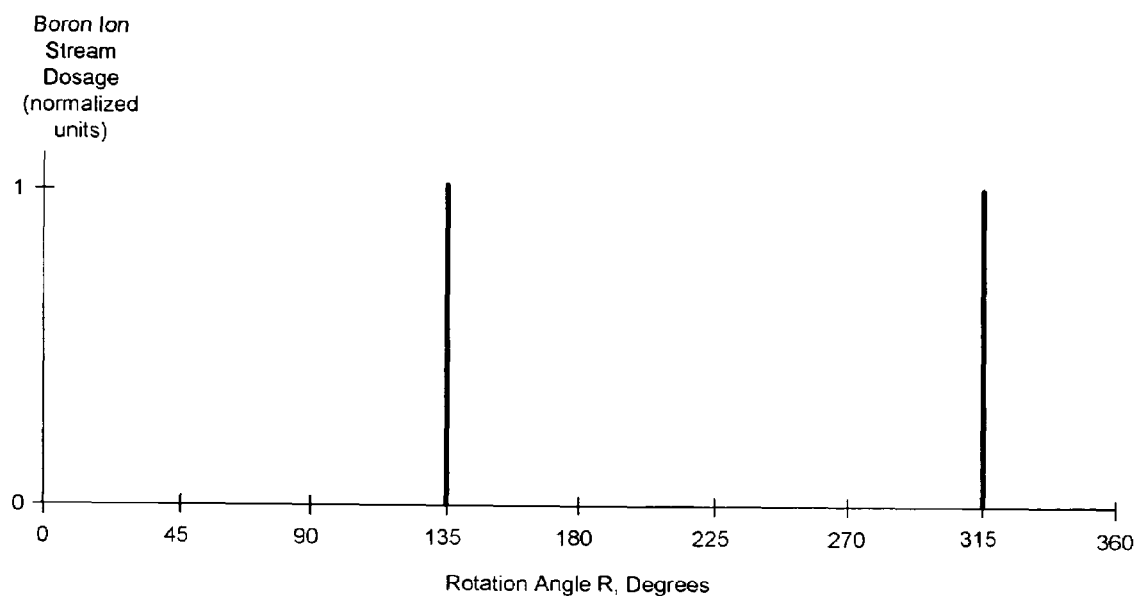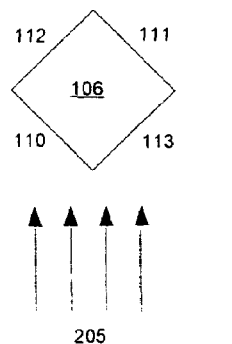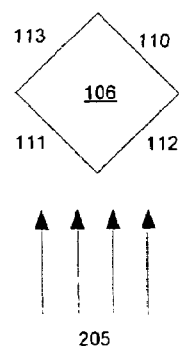
Fig. 12

LOW-LEAKAGE TRANSISTOR AND MANUFACTURING METHOD THEREOF

BACKGROUND

N-type field-effect transistors (NFETs) are electrically and physically isolated from other components on a semiconductor device by a shallow trench isolation (STI) layer. For example, FIG. 1 shows a conventional NFET device having a silicon layer 101 (such as a silicon substrate), an STI layer 102, and a polysilicon gate 103 disposed on silicon substrate 101 and STI layer 102. An active (i.e., channel) area 106 for the NFET channel is defined in a region of silicon substrate 101 surrounded by STI layer 102. In addition, a divot 105 at the junction between STI layer 102 and active area 106 is created as a side effect of STI layer 102 formation. This divot 105 can cause undesirable electric field concentration in the region of divot 105, thereby causing as excess current leakage due to a lowering of the threshold voltage.

To reduce these undesirable effects of divot 105, corner boron implanting has been used prior to STI filling. In this technique, the boron concentration at the active area side of divot 105 is increased by implanting boron ions using a stream 205 angled at about a twenty-degree tilt, as shown in FIG. 2(b). Boron ion stream 205 may be generated by a known boron ion stream source (not shown). As can be seen in FIG. 2(a), boron implantation is sequentially performed on each side 110, 111, 112, 113 of generally rectangular (for example, square) active area 106 by rotating the semiconductor device in ninety-degree increments and performing an intermittent boron implant for each side of active area 106. Alternatively, a continuous boron ion stream is sometimes used while the semiconductor device is continuously rotated. Boron ion stream 205 also penetrates the exposed bottom 211 of trench 210 that surrounds activate area 106 (i.e., the trench that is later filled with STI layer 102). Boron ion stream 205 is prevented from reaching the top of active area 106 by a SiN mask layer 201.

However, the above process has limitations. As semiconductor devices become increasingly smaller, the spaces between components have also become smaller, making it more difficult to effectively perform corner boron implantation. For example, referring to FIG. 2(c), when resist layer 202 is disposed over a neighboring P-type field-effect transistor (PFET) 203, the available space through which boron ion stream 205 may reach the sidewalls of active area 106 becomes quite narrow. As the space between NFET 106 and PFET 203 becomes narrower, implant shadowing (i.e., partial or even full blocking of the boron ion stream) caused by resist layer 202 becomes more of a problem. In fact, there may be a point where the space between NFET 106 and PFET 203 is so narrow that boron ion stream 205 cannot effectively reach sidewalls 110-113 at all. Others have attempted to overcome the problem of implant shadowing by forming resist layer 202 as a thinner layer. However, this makes the manufacturing process susceptible to a number of additional problems, such as having to deal with a non-uniform thickness of resist layer 202 and a smaller allowable dosage of boron implantation that may be performed (since a thinner resist layer does not mask boron ion implantation as effectively as a thicker resist layer).

SUMMARY

There is therefore a need to develop a better way to reduce the undesirable effects of an STI divot at the junction of the STI and the gate of a FET. In addition, there is a need to be able to do this effectively even though components are progressively being made smaller and more crowded together.

For example, in accordance with an aspect of the present disclosure, an ion stream may be used to implant ions into the sidewalls of a FET active area, wherein the ion stream may have both vertical tilt and horizontal rotation components, relative to the sidewalls and/or the silicon device, to provide a better line of sight onto the sidewalls. This may allow the components of the silicon device to be moved closer together without unduly reducing the effectiveness of doping of FET active area sidewalls. Where the FET is an NFET, the ion stream may be a boron ion stream.

Up to a 70%, or even greater, amount of shrinkage may be realized by horizontally rotating the ion stream with respect to the active area sidewalls by a forty-five degree angle. However, other acute angles may also be used as desired depending upon the geometry of the active area and/or other considerations.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIG. 1 is a cross-sectional view of an illustrative semiconductor device having a divot at transistor channel corners.

FIG. 2(a) is a plan view of an active area of an illustrative transistor showing a boron implant with a ninety-degree rotational component relative to a side face of the active area.

FIG. 2(b) is a cross-sectional view of the transistor active area of FIG. 2a.

FIG. 2(c) is another cross sectional view of the transistor active area of FIG. 2a.

FIGS. 11 and 12 are graphs showing illustrative alternatives to the configuration of FIG. 9.

DETAILED DESCRIPTION OF ILLUSTRATIVE EMBODIMENTS

Figure 3:
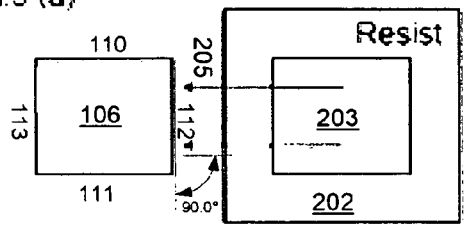
FIG. 3(a) a plan view of a semiconductor device including the transistor of FIG. 2(a) showing a boron implant with a ninety-degree rotational component relative to a side face of the active area.
FIG. 3(b) is a cross-sectional view of the semiconductor device of FIG. 3(a).
FIG. 3(c) a plan view of a semiconductor device including the transistor of FIG. 2(a) showing a boron implant having a rotational component relative to a side face of the active area.
FIG. 3(d) is a cross-sectional view of the semiconductor device of FIG. 3(c).
Figure 3C:
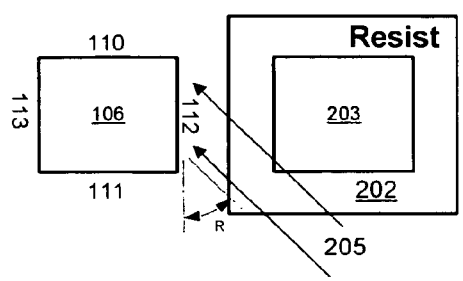
Figure 3:
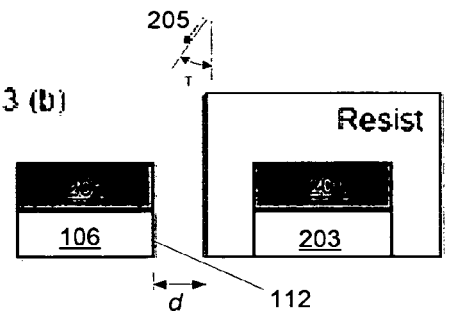
Figure 3:
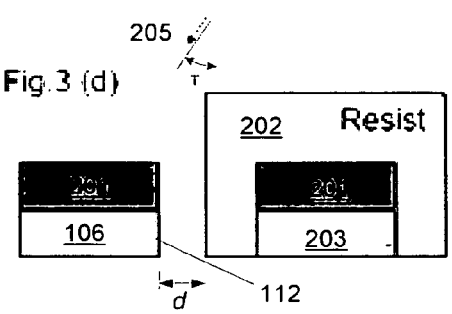
Figure 8:
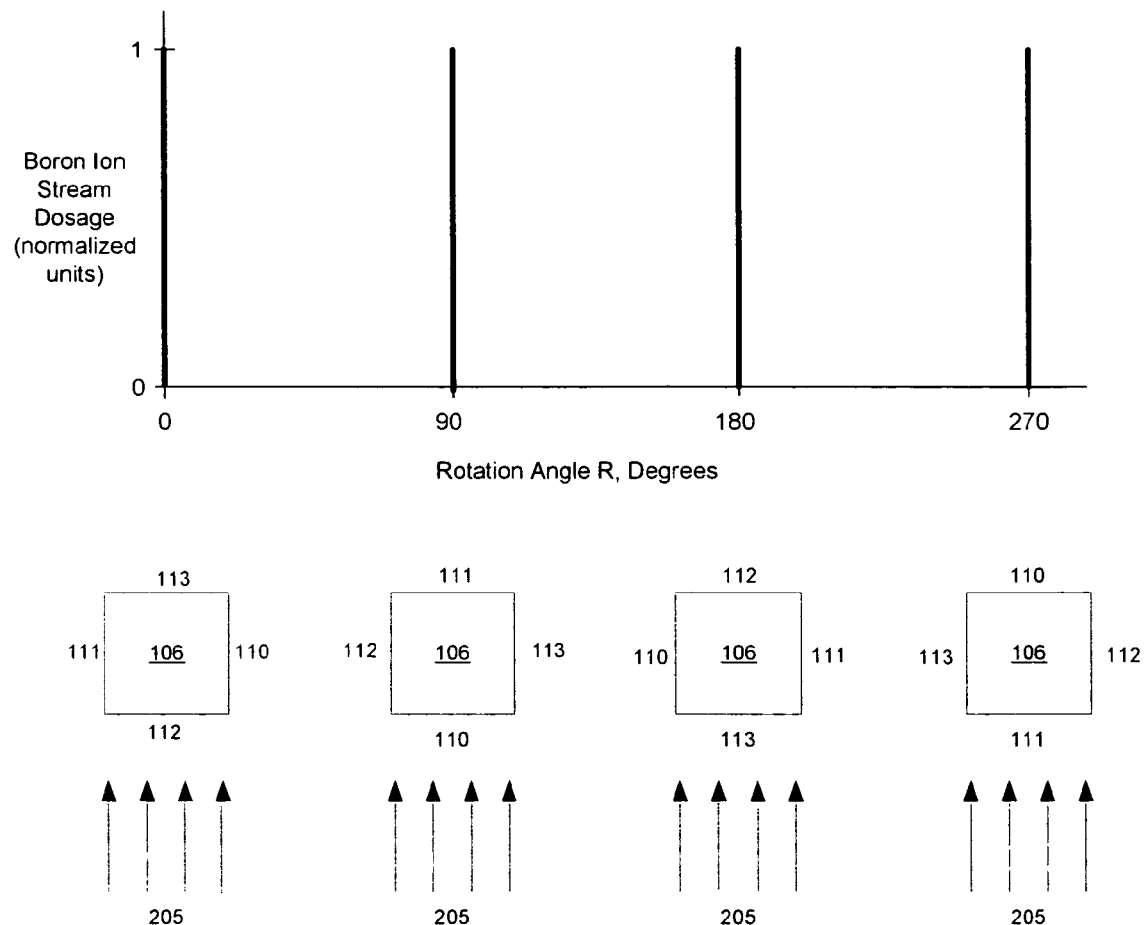
FIG. 8 is a graph showing a ninety-degree rotated intermittent boron stream configuration.

In describing FIGS. 3(a)-(d), it will be assumed that the plan views shown in FIGS. 3(a) and 3(c) are from a top point of view looking down onto the devices depicted. It will be further assumed that the cross-sectional views of FIGS. 3(b) and 3(d) are from a side point of view looking horizontally across the devices from the bottom of FIGS. 3(a) and 3(c). Using these points of view as a reference, boron ion stream 205 has been traditionally directed at the sidewalls of active area 106 with a vertical tilt and a ninety degree horizontal rotation, as shown in FIGS. 3(a) and 3(b). In such a case, boron ion stream 205 may be turned on and off intermittently at certain times, as shown in FIG. 8. As active area 106 is rotated to configurations at 0 degrees, 90 degrees, 180 degrees, and 270 degrees, respectively, boron ion stream 205 is selectively turned on to implant into a different one of sidewalls 112, 110, 113, and 111, respectively. This results in a ninety degree rotation of boron ion stream 205 with respect to each sidewall 110-113 when that sidewall is being implanted. In the FIG. 8 configuration, trench bottom 211 receives four shots of boron ion stream 205 and each sidewall 110-113 receives one shot of boron ion stream 205. Thus, using arbitrary units, one could say that each sidewall 110-113 would have a boron concentration of about one unit and trench bottoms 211 would have a boron concentration of about four units.

Referring to FIG. 3(b), it can be seen that, for a given vertical tilt angle T and a ninety-degree rotation of boron ion stream 205 relative to sidewall 112 (for example), there is a minimum amount of necessary distance d between components to allow for boron ion stream 205 to have a clear line of sight to sidewall 112. If d is too small, then sidewall 112 cannot be properly implanted with boron.

Figure 9:
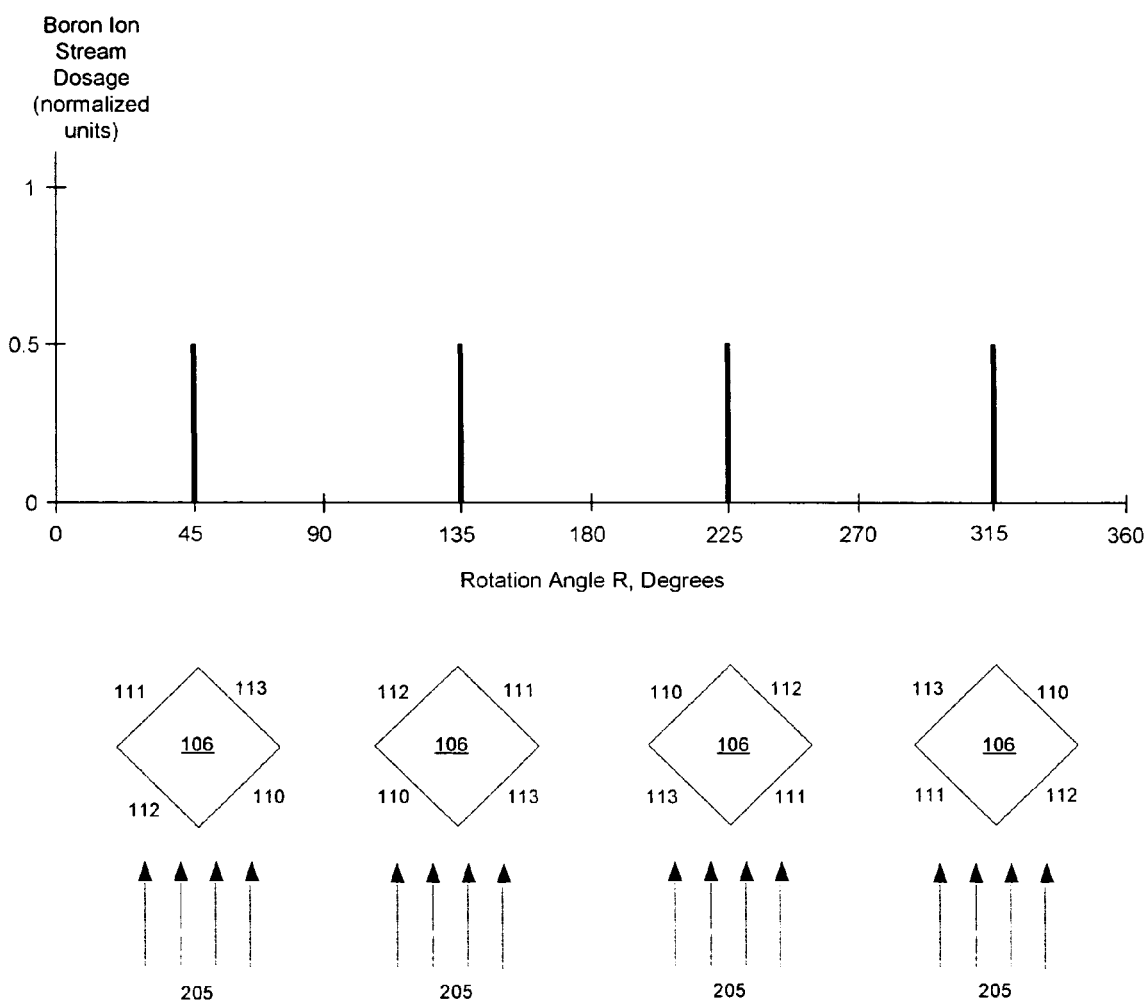
FIG. 9 is a graph showing an illustrative forty-five-degree rotated intermittent boron stream configuration.
Figure 10:
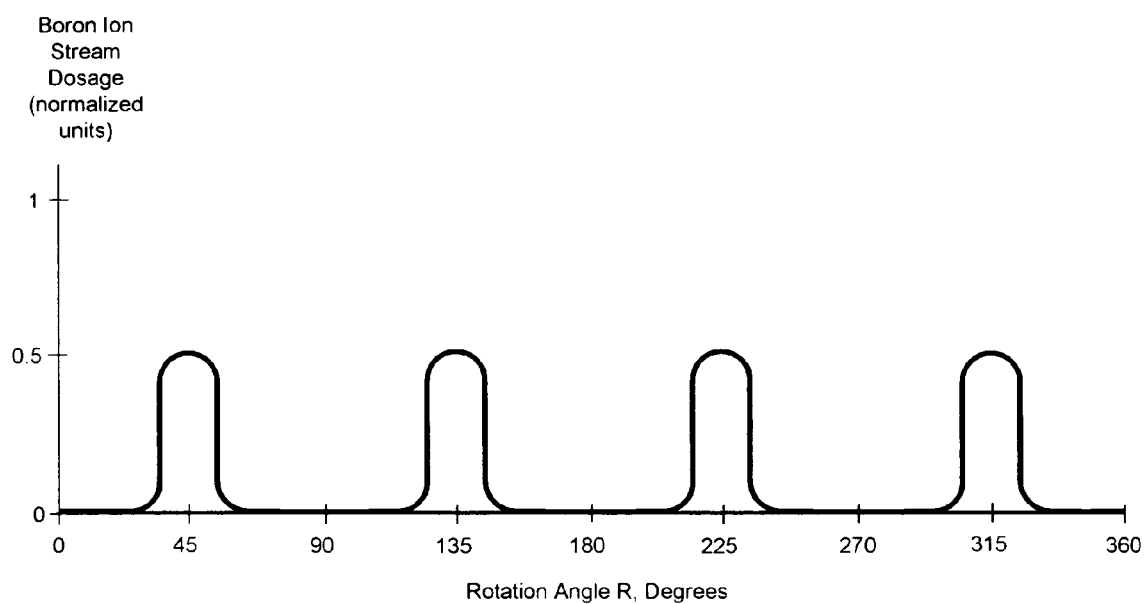
FIG. 10 is another graph showing another illustrative forty-five-degree rotated intermittent boron stream configuration.

Referring now to FIGS. 3(c) and 3(d), it may be advantageous to instead direct an ion stream, such as boron ion stream 205, in a direction having both a vertical tilt angle T and an acute horizontal rotation angle R (such as about 40 to 50 degrees) relative to a sidewall currently being implanted, as shown for example in FIGS. 3(c) and 3(d). In such a case, boron ion stream 205 may be turned on and off intermittently at certain times, such as shown in FIGS. 9 or 10. As active area 106 is sequentially rotated to configurations at 45 degrees, 135 degrees, 225 degrees, and 315 degrees, respectively, boron ion stream 205 is selectively turned on to implant into a different pair of sidewalls 112/110, 110/113, 113/111, and 111/112, respectively. This results in a forty-five degree rotation of boron ion stream 205 with respect to each sidewall 110-113 when that sidewall is being implanted.

More particularly, in this example, active area 106 is first aligned in the "45 degree" alignment as shown such that boron ion stream 205 is simultaneously incident on sidewalls 110 and 112 but not 111 or 113. Then, after a predetermined time period, boron ion stream 205 is turned off or otherwise reduced in power. Next, active area 106 is aligned in the "135 degree" alignment as shown such that boron ion stream 205 is simultaneously incident on sidewalls 110 and 113 but not 111 or 112. Then, after a predetermined time period, boron ion stream 205 is again turned off or otherwise reduced in power. Next, active area 106 is aligned in the "225 degree" alignment as shown such that boron ion stream 205 is simultaneously incident on sidewalls 111 and 113 but not 110 or 112. Then, after a predetermined time period, boron ion stream 205 is again turned off or otherwise reduced in power. Finally, active area 106 is aligned in the "315 degree" alignment as shown such that boron ion stream 205 is simultaneously incident on sidewalls 111 and 112 but not 110 or 113. Then, after a predetermined time period, boron ion stream 205 is again turned off or otherwise reduced in power.

In both FIGS. 9 and 10, boron ion stream 205 is alternatively increased and reduced in power, depending upon the relative orientation between boron ion stream 205 and silicon layer 101 and/or region 106. According to FIG. 9, boron ion stream 205 is turned on only at certain individual angles 45 degrees, 135 degrees, 225 degrees, and 315 degrees. This may be accomplished by, for example, first appropriately positioning silicon layer 101 relative to the expected boron ion stream 205, and then, while maintaining the positioning, turning on and then off boron ion stream 205. In another example, according to FIG. 10, boron ion stream 205 is turned on over a subset range of angles. For example, boron ion stream 205 is turned on (albeit at varying amounts of power) over the range R=about 30 degrees to about 60 degrees. This may occur where silicon layer 101 is not stopped prior to engaging boron ion stream 205, but instead is continuously rotating while boron ion stream 205 is turned on and off at appropriate times. Of course, it is possible to maintain some low baseline amount of power of boron ion stream 205, as desired, as an alternative to completely powering off boron ion stream 205. It should also be noted that, in this example, the peak amount of power in boron ion stream 205 occurs at the key angles in this example, that is, 45 degrees, 135 degrees, 225 degrees, and 315 degrees.

As discussed above in connection with FIG. 9, boron ion stream 205 is simultaneously incident on two adjacent sidewalls of active area 106 when the rotation angle R is at 45, 135, 225, and 315 degrees (or variations thereof). Thus, by the time the entire process in FIG. 9 has been completed, each of sidewalls 110-113 will have received two boron ion stream 205 shots. This means that in the case of FIG. 9, to maintain the same boron concentration at sidewalls 110-113, the boron dosage for each shot should be decreased by approximately half as compared with the case of FIG. 8. This provides the added benefit that the boron concentration in trench bottoms 211 will also be decreased by approximately one half as compared with the case of FIG. 8. Thus, using the same arbitrary units as in FIG. 8, under the FIG. 9 configuration each sidewall 110-113 would have an average boron ion concentration of about one unit, and trench bottoms 211 would have an average boron ion concentration of about two units—half that as in FIG. 8. A lower boron concentration in trench bottoms 211 reduces (and thus improves) junction leakage at the P-well/N-well junction. In the case of FIG. 8, the boron concentration in trench bottoms 211 will be, on average, approximately four times that of the boron concentration in sidewalls 110-113. However, in the case of FIG. 9, the boron concentration in trench bottoms 211 will only be, on average, approximately two times that of the boron concentration in sidewalls 110-113.

Figure 11:
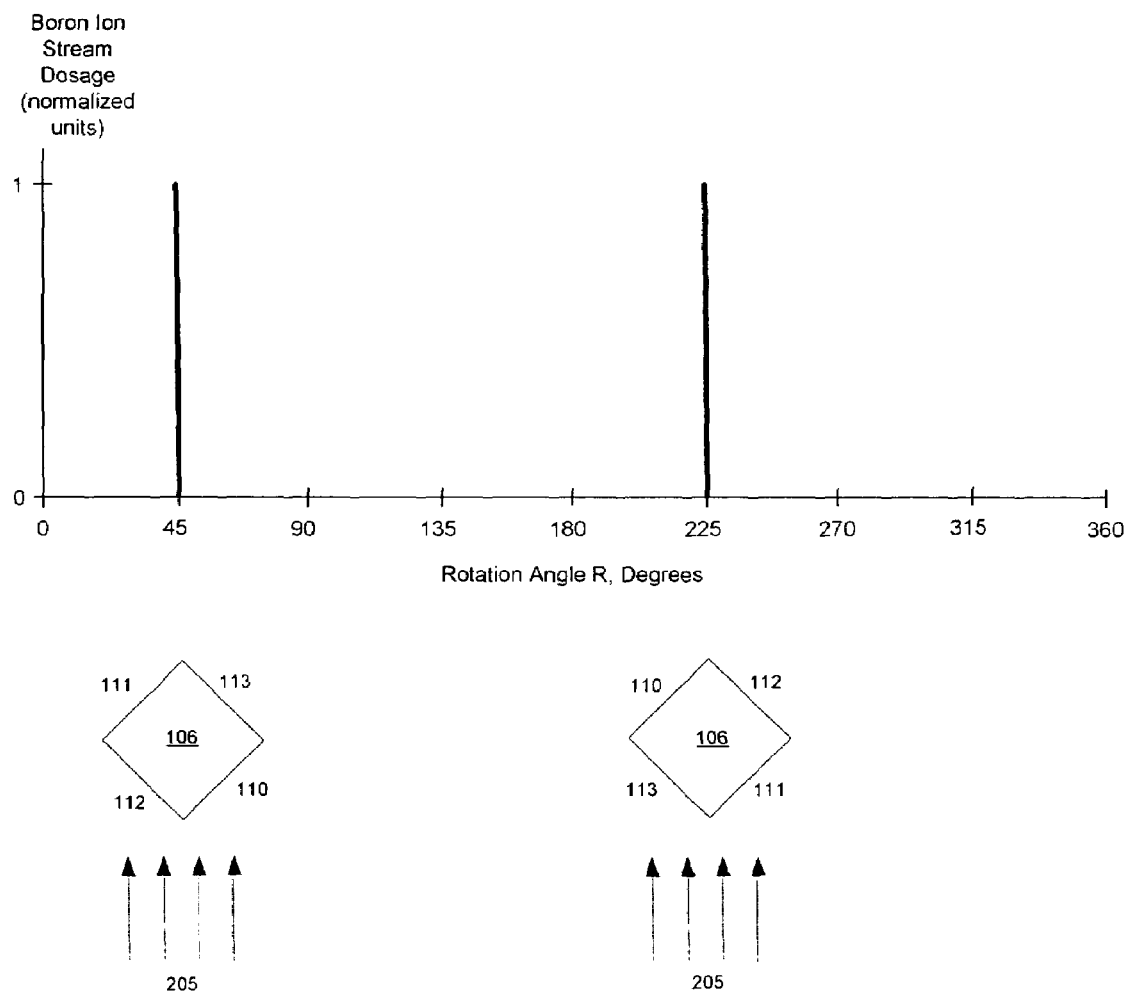

Alternatively, only two of the four positions shown in FIG. 9 could be used for boron implantation. In one case, only the R=45 degrees and R=225 degrees positions may be used, as shown for example in FIG. 11. In a second case, only the R=135 degrees and R=315 degrees positions may be used, as shown for example in FIG. 12. By using only two out of the four possible positions, each of sidewalls 110-113, as well as each of the trench bottom 211 portions for each side of active area 106, will receive only a single shot of boron, in total. Thus, the boron dosage of each of the two shots would be the same as the conventional dosage in FIG. 8. This would result in an average boron concentration in each of sidewalls 110-113 of about one unit and an average boron concentration in trench bottoms 211 of about two units. Again, trench bottom 211 would receive, on average, half the total dosage as traditionally received. This alternative has the further advantage of higher throughput (since only two dose shots are needed) and lower cost.

The appropriate angles of boron ion stream 205 relative to silicon layer 101 and/or active area 106 may be accomplished in various ways. For example, silicon layer 101 may be rotated about a fixed axis normal to the plane of silicon layer 101 while the source of boron ion stream 205 is maintained in a fixed position and angle. This is likely the most economical and practical solution. However, silicon layer 101 may alternatively be maintained in a fixed position while the source of boron ion stream 205 is moved as appropriate. A third option is to move both silicon layer 101 and the source of boron ion stream 205.

Although the rotation angle of boron ion stream 205 relative to a given sidewall of active area 106 is shown as always being 45 degrees in these examples, any acute angle may be used, such as any angle from 40 to 50 degrees, inclusive, or any angle from 20 to 70 degrees, inclusive. The particular angle chosen may depend upon the geometry of the semiconductor device and/or the active area 106. In addition, the relative rotation angle between boron ion stream 205 and the various sidewalls 110-113 may be different among one or more of the various sidewalls 110-113.

In the embodiment shown in FIGS. 3(a) and 3(b), as well as in the embodiment shown in FIGS. 3(c) and 3(d), boron ion stream 205 have a vertical tilt angle T. As T becomes smaller, so does the minimum allowable value of distance d. However, the minimum allowable value of distance d can be made even smaller for a given value of T by adding an acute angle horizontal rotation component to the direction of boron ion stream 205, such as is the case in FIGS. 3(c) and 3(d). This is advantageous because a very small value of T is less effective than a larger value of T.

Figure 4:
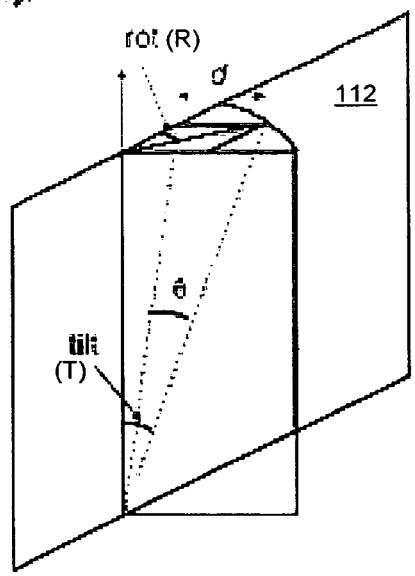
FIG. 4 is a perspective view of a face of the active area of the transistor of FIGS. 3(c) and 3(d).

Thus, adding an acute rotational component to the directionality of boron ion stream 205 allows one to reduce distance d without necessarily reducing tilt angle T. Minimum allowable distance d may be calculated as shown in FIG. 4 for a given tilt angle T and a given rotational angle R. In particular, distance d may be calculated by taking the tangent of tilt angle T and dividing it by the square root of the following: one plus the squared inverse of the tangent of rotation angle R. By adding the R acute angular component to the directionality of boron ion stream 205, the total incident angle θ relative to sidewall 112 (assuming in this example that sidewall 112 is perfectly vertical, or orthogonal to silicon layer 101) may be increased for a given tilt angle T. Incident angle θ may be calculated by taking the tangent of T multiplied by the tangent of R and dividing that result by the square root of the following: one plus the squared tangent of T plus the squared tangent of R. Then, the inverse tangent of the resulting fraction is taken, thus finally resulting in incident angle θ.

Figure 5:
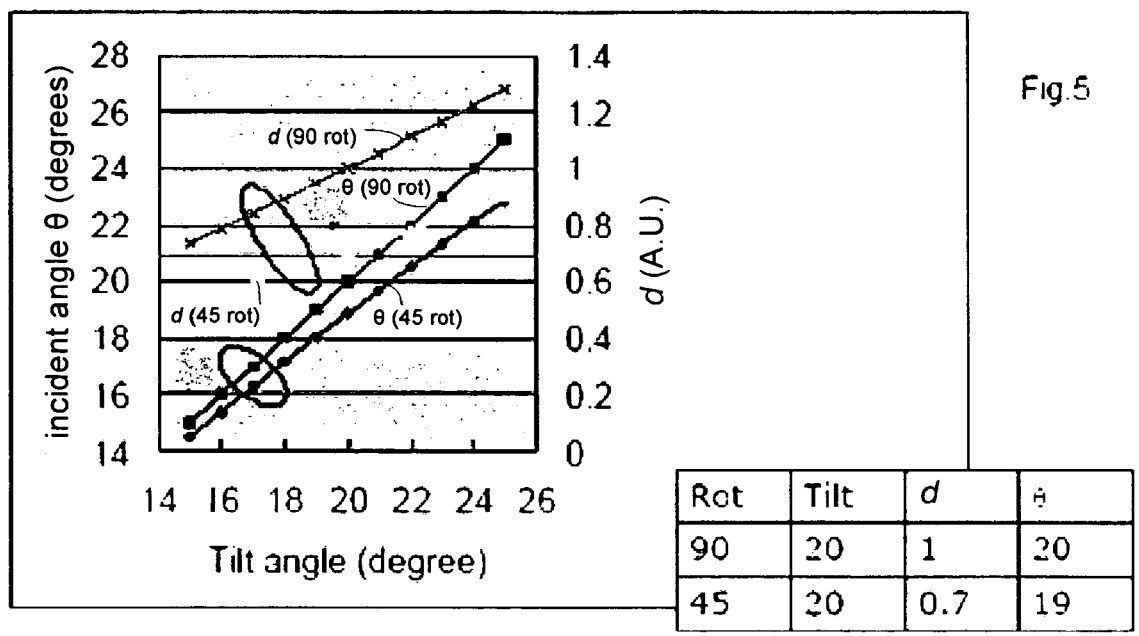
FIG. 5 is a graph showing illustrative angles of boron implantation that may be used.

Referring to FIG. 5, illustrative results are shown of using the equations of FIG. 4 described previously for an illustrative range of tilt angles T with respect to both 90 degree and 45 degree angles R with respect to sidewall 112 (for example). It is clear from FIG. 5 that a lower value of d is derived by adding an acute rotational component such as 45 degrees rotation. For example, where the rotational component is not acute and is 90 degrees, and the tilt T is 20 degrees, then distance d in this example is 1. But where rotational component is acute and is 45 degrees, then for the same tile T, distance d is only 0.7.

Figure 6:
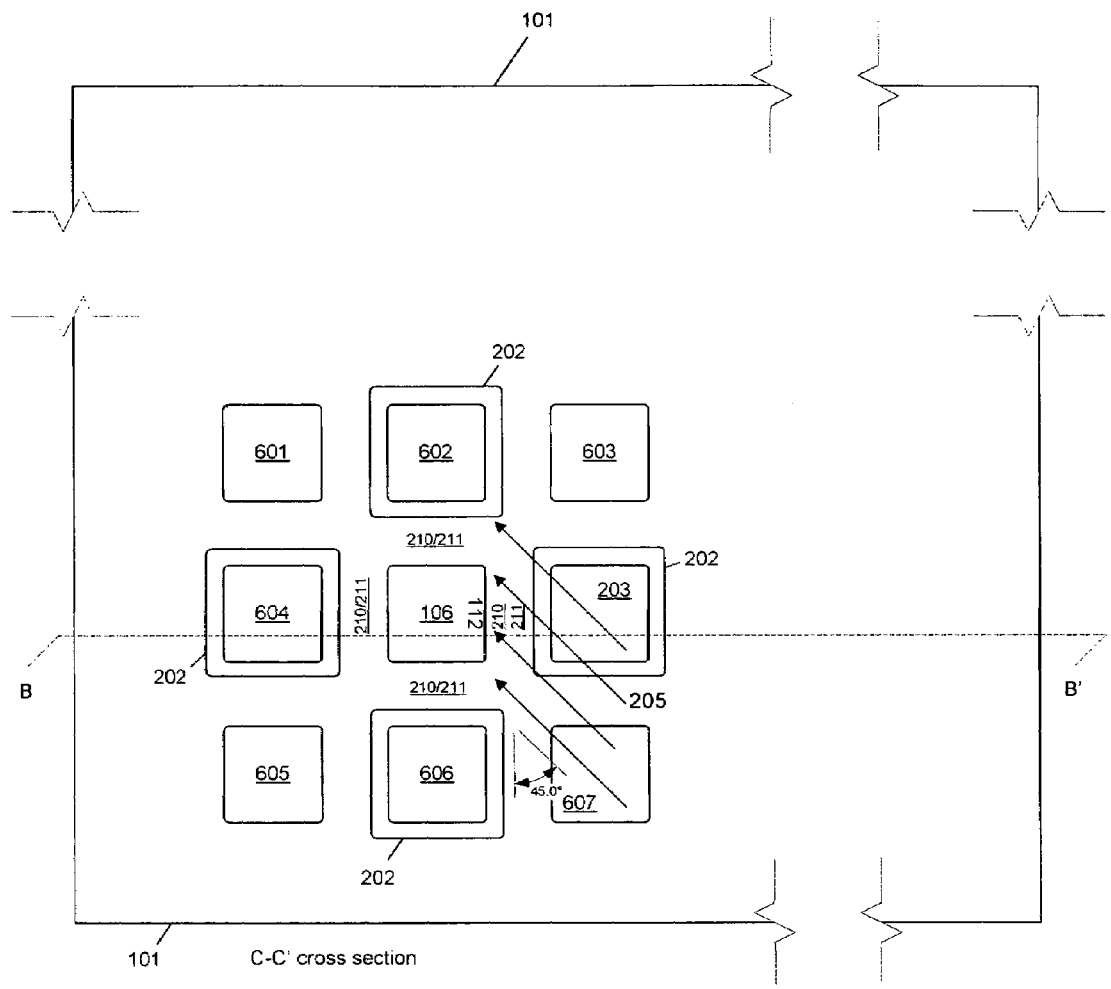
FIG. 6 is a first cross-sectional view of a semiconductor device including a plurality of components.
Figure 7:
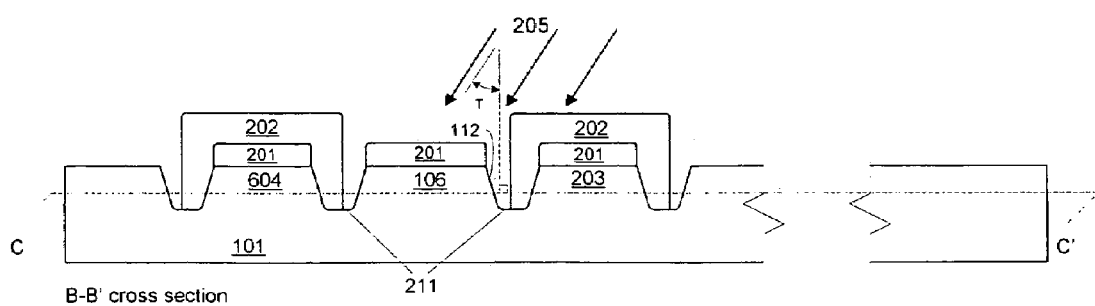
FIG. 7 is a second cross-sectional view of the semiconductor device of FIG. 6.

Referring to FIG. 6, which shows a cross-section C-C' of FIG. 7, components may be distributed on and/or in silicon layer 101 in any arrangement such as, but not limited to, a regular arrangement of straight rows and columns as shown. In this example, components 106, 203, and 601-607 are shown to be included in and/or on silicon layer 101. Silicon layer 101 has a thickness as shown in FIG. 7 and extends in length and width along a plane, as shown in FIG. 6. Each component may define a region of silicon layer 101 and may together define a plane parallel to or equal to the plane defined by silicon layer 101. An example of such a plane is cross-section C-C'.

As can be seen in FIG. 6, boron ion stream 205 is at an acute angle (in this example, 45 degrees) relative to sidewall 112, when measured in the plane defined by the various regions and by silicon layer 101 itself. In other words, if the direction of boron ion stream 205 were projected normally onto the plane, the angle in the plane relative to sidewall 112 would be an acute angle.

FIG. 7 shows a cross-section B-B' of FIG. 7. Tilt angle T, the other component of boron ion stream 205, is also acute relative to the normal of the plane of silicon layer 101 when measured in a plane orthogonal to both the plane of silicon layer 101 and sidewall 112. An example of such a plane is cross-section B-B'. In other words, if the direction of boron ion stream 205 were projected normally onto the plane of cross-section B-B', then the angle in that plane relative to the normal of plane C-C' would be angle T, which would be acute. For example, T may be in the range of 14 to 26 degrees, inclusive. However, T may be any acute angle. As previously noted, boron ion stream 205 becomes less effective as T becomes smaller (i.e., as boron ion stream 205 becomes steeper). Also as previously noted, T may be prevented from becoming to small by also introducing acute angle R as a component of the directionality of boron ion stream 205.

It should be noted that, although the various embodiments described herein have dealt with boron doping of NFET active area sidewalls, the various aspects of the embodiment may additionally or alternatively be applied to the ion doping of PFET active area sidewalls in the same manner, but using an appropriate ion as desired other than boron.

Thus, an improved way to reduce the undesirable effects of an STI divot at the junction of the STI and the gate of a FET has been described. This may be accomplished while maintaining the effectiveness of boron doping (or doping with another ion) even though components are progressively being made smaller and more crowded together.

What is claimed is:

1. A method, comprising:
   obtaining a silicon layer having a plurality of regions distributed in a same first plane, wherein each region is separated from a neighboring region by a respective trench in the silicon layer, and wherein each region has first, second, third, and fourth sidewalls that together define a boundary of a rectangular surface and that is each also a side of one of the trenches;
   causing the silicon layer and a boron ion source to be oriented with respect to each other at a first relative orientation;
   while the silicon layer and the ion source are at the first relative orientation, directing ions into the silicon layer in a direction having a first angular component that, when measured in the first plane with respect to the first sidewall, is 45 degrees;
   causing the silicon layer and the ion source to be oriented with respect to each other at a second relative orientation different from the first relative orientation;
   while the silicon layer and the ion source are at the second relative orientation, directing ions into the silicon layer in a direction having a second angular component that, when measured in the first plane with respect to the second sidewall, is 45 degrees;

causing the silicon layer and the ion source to be oriented with respect to each other at a third relative orientation different from the first and second relative orientations;

while the silicon layer and the ion source are at the third relative orientation, directing ions into the silicon layer in a direction having a third angular component that, when measured with respect to the third sidewall within the plane parallel to the first plane, is 45 degrees;

causing the silicon layer and the ion source to be oriented with respect to each other at a fourth relative orientation different from the first, second, and third relative orientations; and while the silicon layer and the ion source are at the fourth relative orientation, directing ions into the silicon layer in a direction having a fourth angular component that, when measured with respect to the fourth sidewall within the plane parallel to the first plane, is 45 degrees, thereby producing a boron concentration in a bottom of each of the trenches that is on average twice that of a boron concentration in each of the first, second, third, and fourth sidewalls.

2. The method of claim 1, further including covering each of a subset of the regions with a resist layer, such that during performance of the steps of directing the ions in the direction having a first angular component and of directing the ions in the direction having a second angular component, of directing the ions in the direction having a first angular component and of directing the ions in the direction having a second angular component, each of the subset of the regions is covered by the resist layer.

3. The method of claim 1, further including forming a polysilicon layer on each of the plurality of regions.

4. The method of claim 1, further including forming a shallow-trench isolation layer in each of the trenches.

5. A method, comprising:

obtaining a silicon layer having a first region surrounded by a trench and a second region on an opposing side of the trench, wherein the first region has first, second, and third side surfaces each orthogonal to one of the other side surfaces and forming a sidewall of the trench; and alternately increasing and reducing an amount of an ion stream during each of a plurality of sequential time intervals and rotating the silicon layer by ninety degrees between each sequential increase in the amount of the ion stream, such that during a first one of the time intervals and while the ion stream amount is at an increased level, the ion stream is simultaneously incident on both the first and second side surfaces, and during a second one of the time intervals and while the ion stream amount is at the increased level, the ion stream is simultaneously incident on both the second and third side surfaces, thereby producing a boron concentration in a bottom of the trench that is on average twice that of a boron concentration in each of the first, and third side surfaces.

6. The method of claim 5, wherein the step of alternately increasing and reducing the amount of the ion stream includes alternately increasing from, and reducing the amount of the ion stream to, a zero amount.

7. The method of claim 5, wherein rotating the silicon layer comprises rotating the silicon layer about a first axis, and during the first time interval and while the ion stream amount is at an increased level, the ion stream contacts the first side surface at an incident angle relative to the first side surface, wherein the incident angle includes a rotational component about the first axis in the range of 40 to 50 degrees, inclusive.

8. The method of claim 7, wherein the rotational component about the first axis is 45 degrees.

9. The method of claim 5, wherein the ions are boron ions.

10. A method, comprising:

providing a silicon layer having a region surrounded by a trench in the silicon layer, and wherein the region has first, second, third, and fourth sidewalls that together define a boundary of a rectangular surface and that is each also a side of the trench;

first directing a boron ion stream so as to be simultaneously incident on the first and second sidewalls;

second directing the boron ion stream so as to be simultaneously incident on the second and third sidewalls;

third directing the boron ion stream so as to be simultaneously incident on the third and fourth sidewalls; and fourth directing the boron ion stream so as to be simultaneously incident on the fourth and first sidewalls, thereby producing a boron concentration in a bottom of the trench that is on average twice that of a boron concentration in each of the first, second, third, and fourth sidewalls.

11. The method of claim 10, further comprising:

after first directing the boron ion stream and prior to second directing the boron ion stream, rotating the silicon layer by 90 degrees;

after second directing the boron ion stream and prior to third directing the boron ion stream, rotating the silicon layer by 90 degrees; and after third directing the boron ion stream and prior to fourth directing the boron ion stream, rotating the silicon layer by 90 degrees.

* * * * *

UNITED STATES PATENT AND TRADEMARK OFFICE
CERTIFICATE OF CORRECTION

PATENT NO. : 7,550,355 B2  
APPLICATION NO. : 11/212599  
DATED : June 23, 2009  
INVENTOR(S) : Yusuke Kohyama Page 1 of 1

It is certified that error appears in the above-identified patent and that said Letters Patent is hereby corrected as shown below:

In Column 7, Claim 2, in lines 28-31:

Please delete "of directing the ions in the direction having a first angular component and of directing the ions in the direction having a second angular component,".

Signed and Sealed this  
Twenty-eighth Day of December, 2010

David J. Kappos  
*Director of the United States Patent and Trademark Office*